United States Patent
Chang et al.

(10) Patent No.: US 10,644,016 B2
(45) Date of Patent: May 5, 2020

(54) CHARGE-TRAPPING MEMORY DEVICE

(71) Applicant: Cypress Semiconductor Corporation, San Jose, CA (US)

(72) Inventors: Kuo Tung Chang, Saratoga, CA (US); Shenqing Fang, Fremont, CA (US); Timothy Thurgate, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 10 days.

(21) Appl. No.: 14/527,797

(22) Filed: Oct. 30, 2014

(65) Prior Publication Data

US 2016/0126250 A1 May 5, 2016

(51) Int. Cl.
| | | |
|---|---|---|
| *H01L 27/115* | (2017.01) | |
| *H01L 27/11568* | (2017.01) | |
| *H01L 29/792* | (2006.01) | |
| *H01L 29/423* | (2006.01) | |
| *H01L 21/762* | (2006.01) | |
| *H01L 21/28* | (2006.01) | |
| *H01L 27/11521* | (2017.01) | |
| *H01L 29/06* | (2006.01) | |

(52) U.S. Cl.
CPC .. *H01L 27/11568* (2013.01); *H01L 21/76224* (2013.01); *H01L 27/11521* (2013.01); *H01L 29/40114* (2019.08); *H01L 29/40117* (2019.08); *H01L 29/4234* (2013.01); *H01L 29/42324* (2013.01); *H01L 29/792* (2013.01); *H01L 29/0649* (2013.01)

(58) Field of Classification Search
CPC ......... H01L 27/11568; H01L 21/28282; H01L 21/02233; H01L 29/518; H01L 29/42364; H01L 29/513; H01L 29/0649; H01L 21/76224; H01L 29/4916; H01L 29/4234; H01L 29/792; H01L 29/66833; H01L 21/0217
See application file for complete search history.

(56) References Cited

U.S. PATENT DOCUMENTS

| | | | |
|---|---|---|---|
| 5,754,476 A | * | 5/1998 | Caser .................... H02M 3/073 327/536 |
| 7,675,104 B2 | | 3/2010 | Joshi et al. |
| 8,143,661 B2 | | 3/2012 | Fang et al. |
| | | | (Continued) |

OTHER PUBLICATIONS

Goda, A., et al., "Scaling Directions for 2D and 3D NAND Cells," IEDM 2012; pp. 13-16.

(Continued)

*Primary Examiner* — Marcos D. Pizarro
*Assistant Examiner* — Sue Tang

(57) ABSTRACT

A structure and method for providing improved and reliable charge trapping memory device are disclosed herein. A charge trapping field effect transistor (FET) comprising a semiconductor substrate, a doped region in the semiconductor substrate, and a gate structure on the semiconductor substrate and a method of fabricating the same are also discussed. The doped region comprises a first lateral dimension along a first direction. The gate structure comprises a charge trapping dielectric region and a charge trapping conductive region in contact with the charge trapping dielectric region.

24 Claims, 10 Drawing Sheets

(56) References Cited

U.S. PATENT DOCUMENTS

| | | | | |
|---|---|---|---|---|
| 2006/0163644 A1* | 7/2006 | Bhattacharyya | ... | G11C 16/0483 257/316 |
| 2008/0083946 A1* | 4/2008 | Fang | ................ | H01L 21/28273 257/324 |
| 2008/0090351 A1* | 4/2008 | Mokhlesi | ............ | G11C 11/5628 438/257 |
| 2008/0160680 A1* | 7/2008 | Yuan | ................ | H01L 27/11568 438/129 |
| 2008/0169501 A1* | 7/2008 | Yang | ................ | H01L 21/28273 257/321 |
| 2009/0262583 A1* | 10/2009 | Lue | ................... | G11C 16/0408 365/185.28 |
| 2012/0025297 A1* | 2/2012 | Takashima | ........ | H01L 21/02145 257/324 |
| 2013/0240976 A1* | 9/2013 | Tanaka | .............. | H01L 21/02329 257/324 |
| 2014/0312408 A1* | 10/2014 | Fang | ..................... | H01L 29/792 257/324 |
| 2015/0001607 A1* | 1/2015 | Lee | ................... | H01L 29/42324 257/321 |

OTHER PUBLICATIONS

Haddad, S., et al., "Highly Scalable and Manufacturable Heterogeneous Charge Trap NAND Technology," Memory Workshop, 2013 IEEE; 4 pages.

Lue, H.T., et al., "Scaling Feasibility Study of Planar Thin Floating Gate (FG) NAND Flash Devices and Size Effect Challenges Beyond 20nm," IEDM 2011; pp. 203-206.

Ramaswamy, N., et al., "Engineering a Planar NAND Cell Scalable to 20nm and Beyond," Memory Workshop, 2013 IEEE; 4 pages.

Lau, W.S., "Stability of electrical properties of nitrogenrich, siliconrich, and stoichiometric siliconnitride films," Journal of Applied Physics, vol. 66, pp. 2765-2767 (1989); 4 pages.

* cited by examiner

CHARGE-TRAPPING MEMORY DEVICE

BACKGROUND

Field

The present application relates generally to a charge trap memory device and methods of fabricating the same.

Background

Memory devices can be broadly categorized into two classes: volatile memory and non-volatile memory. Volatile memory (e.g., SRAM, DRAM, or the like) lose their data content when the power supply is removed. In contrast, non-volatile memories (e.g., EEPROM, flash memories, or the like) maintain their data content after the power supply has been removed.

Flash memory is a non-voltage memory that can be electrically erased and reprogrammed. One common type of flash memory device is charge-trapping (CT) flash memory. The basic architecture of a CT flash memory cell includes a CT layer in a semiconductor transistor. The electrical isolation of the CT layer is accomplished by surrounding it with dielectric material, such as an oxide. Typically, charge trap flash memory cells use two oxide layers, a "bottom" oxide layer and a "top" oxide layer.

SUMMARY

Degraded flash memory cell performance can result from CT layer issues such as charge leakage. Described herein are embodiments of a CT memory device with improved and reliable performance, and methods for fabricating these and other CT memory device embodiments.

According to an embodiment, a charge trapping field effect transistor (FET), includes a semiconductor substrate, a doped region in the semiconductor substrate, and a gate structure on the semiconductor substrate. The doped region includes a first lateral dimension along a first direction. The gate structure includes a charge trapping dielectric region and a charge trapping conductive region in contact with the charge trapping dielectric region.

According to another embodiment, a memory device includes a substrate and an array of memory cells. Each memory cell includes a doped region in the substrate and a gate structure on the substrate. The doped region includes a first lateral dimension along a first direction. The gate structure includes a charge trapping dielectric region and a charge trapping conductive region in contact with the charge trapping dielectric region.

According to another embodiment, a method of a charge trapping memory device includes forming isolation regions in a substrate, forming a charge trapping conductive region adjacent to the isolation region, forming a charge trapping dielectric region on the charge trapping conductive region, and forming a doped region in the substrate Further features and advantages of the present disclosure, as well as the structure and operation of various embodiments of the present disclosure, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings are incorporated herein and form a part of the specification.

FIGS. 2A-8A and 2B-8B illustrate schematic cross-sectional views along lines A-A and B-B, respectively, of the memory device of FIG. 1A at various stages of its fabrication process, according to an example embodiment.

Figure 1A:
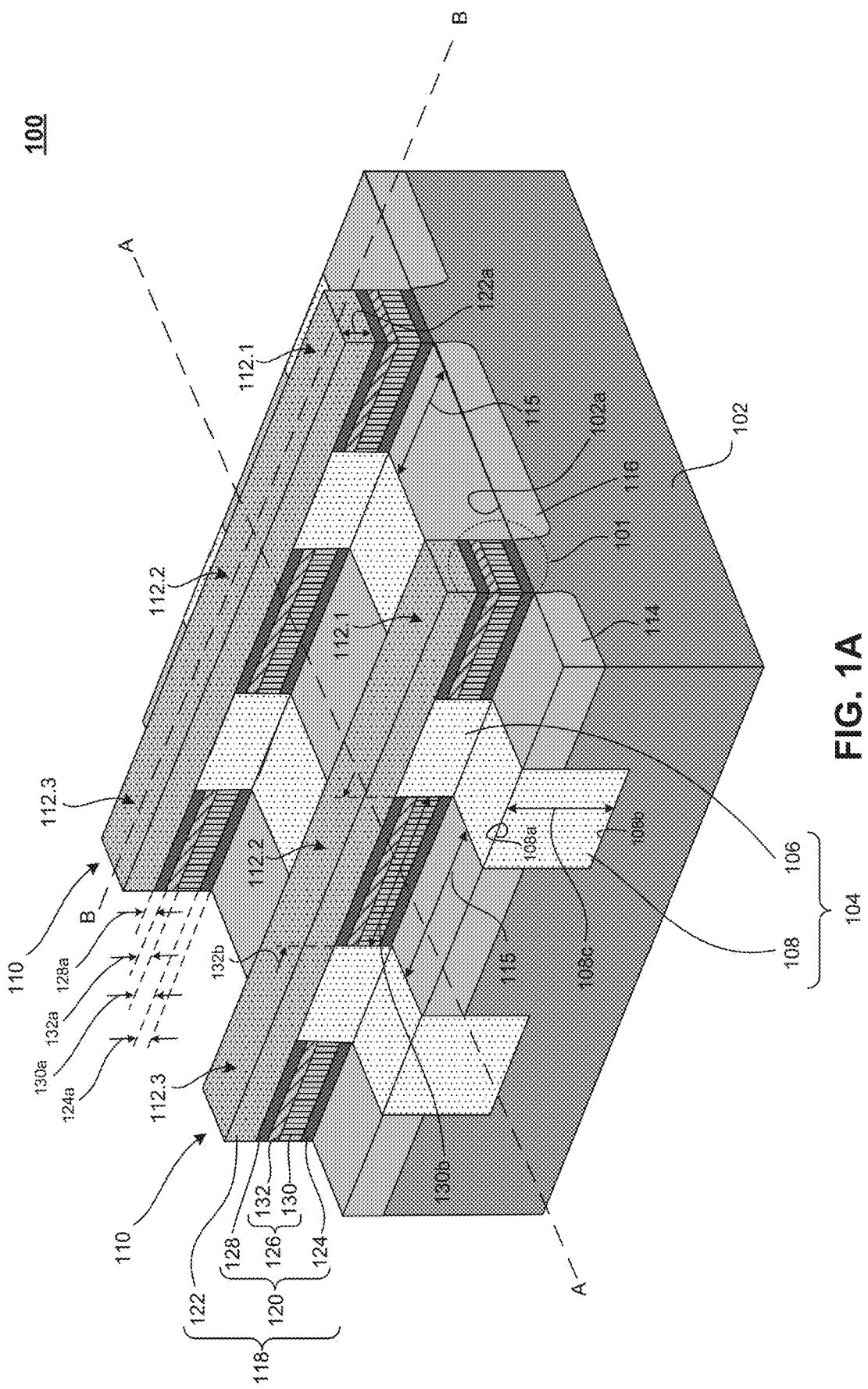
FIG. 1A illustrates a schematic of a memory device, according to an example embodiment.

The present disclosure will now be described with reference to the accompanying drawings. In the drawings, like reference numbers generally indicate identical or similar elements. Additionally, generally, the left-most digit(s) of a reference number identifies the drawing in which the reference number first appears.

DETAILED DESCRIPTION

A Memory Device According to an Embodiment

FIG. 1A illustrates a memory device 100, according to an embodiment. Memory device 100 may include a substrate 102, isolation regions 104, and rows 110 of CT field effect transistor (CT-FET) based memory cells (hereinafter referred to as CT-FETs) 112.1 through 112.3. It should be noted that the two rows 110 of CT-FETs with each row having three CT-FETs 112.1-112.3, as shown in FIG. 1A, is for illustrative purposes, and is not limiting. As would be understood by a person of skill in the art based on the description herein, memory device 100 may include any suitable number of rows of CT-FETs with each row having any suitable number of CT-FETs similar to any one of CT-FETs 112.1-112.3. In addition, memory device 100 may include other devices and functional units that are not shown for the sake of simplicity. It is to be appreciated that embodiments of the present disclosure may be applied to any CT-FET based memory device. For example, embodiments of the present disclosure may apply to a CT-NAND memory device and/or a CT-NOR memory device.

Substrate 102 may be a bulk semiconductor substrate comprising a bulk semiconductor material such as, but not limited to, silicon, germanium, gallium arsenide, indium phosphide, or any combination thereof, according to various examples of this embodiment. Bulk semiconductor material of substrate 102 may be implanted with p-type carriers to be a p-type bulk substrate, according to an example embodiment. The p-type carriers may be provided by p-type materials, such as, but not limited boron. Alternatively, substrate 102 may be an n-type substrate formed by implanting in bulk semiconductor material of substrate 102 n-type carriers that are provided by n-type materials, such as, but not limited to, phosphorus.

In an example embodiment, isolation regions 104 may be configured to provide electrical isolation to CT-FETs 112.1-112.3 from each other along row 110. Additionally, isolation regions 104 may provide electrical isolation between CT-FETs 112.1-112.3 and neighboring active and passive elements (not shown) integrated with or deposited on substrate 102. Isolation regions 104 may each include a raised isolation region 106 and a shallow trench isolation (STI) region 108. Raised isolation region 106 may be positioned on and in substantial contact with top surface 102a of substrate 102. STI region 108 may be positioned within substrate 102 and may have a vertical dimension 108c between top surface 108a and bottom surface 108b of STI region 108. In an example, vertical dimension 108c may range from about 250 nm to about 300 nm. Both raised isolation region 106 and STI region 108 may include silicon oxide (SiO2), though any suitable insulating material can be used. Alternatively, raised isolation region 106 and STI region 108 may include different insulating material. It should be noted that the rectangular cross-sectional shapes of raised isolation regions 106 and STI regions 108, as illustrated in FIG. 1A, are for illustrative purposes, and are not limiting. Raised isolation regions 106 and STI regions 108 may have other cross-sectional shapes (e.g., conical, trapezoidal, semi-elliptical, semi-circular), according to various embodiments, without departing from the spirit and scope of the present disclosure.

CT-FETs 112.1-112.3 may each include doped regions 114 and 116 and a gate structure 118. While CT-FETs 112.1-112.3 are shown here to be similar to each other in structure, in alternate embodiments CT-FETs 112.1-112.3 may each have, for example, a distinct gate structure with respect to each other. Doped region 114 may be used as a source/drain region, and similarly, doped region 116 may also be used as a source/drain region. It is understood by a skilled artisan that the source and drain regions of each CT-FETs 112.1-112.3 may be interchangeable and are named based on voltage values applied to doped regions 114 and 116. While doped regions 114 and 116 are n-type in this example, they may also be p-type regions when substrate 102 is n-type Si or an n-type well formed in a p-type Si substrate. Further, doped regions 114 and 116 may be formed, for example, using ion implantation to dope substrate 102 with n-type carriers using n-type materials, such as, but not limited to, arsenic. The n-type carrier concentration in doped regions 114 and 116 may be higher than the p-type carrier concentrations of substrate 102 to form heavily doped regions. Generally, doping a material with a comparatively large doping concentration of carriers equal or greater than $10^{19}/cm^3$, refers to a doping that is high or heavy.

According to an example embodiment, gate structure 118 may be positioned on a top surface 102a of substrate 102 between doped regions 114 and 116 and in substantial contact with at least a portion of doped region 114 and doped region 116. Gate structure 118 may include a charge storage structure 120 and a gate region 122, according to an example embodiment. Charge storage structure 120 may be disposed on top surface 102a of substrate 102 and may include a bottom dielectric region 124, a hybrid CT region 126, and a top dielectric region 128. Bottom dielectric layer 124 may be disposed on and in substantial contact with top surface 102a of substrate 102. The material used to form bottom dielectric region 124 may be, for example, thermal oxide, silicon dioxide, oxynitride, silicon oxynitride, or any combination thereof. Further, bottom dielectric region 124 may have a vertical dimension 124a between top and bottom surfaces of bottom dielectric region 124. In an example, vertical dimension 124a may range from about 3 nm to about 7 nm.

Hybrid CT region 126 may comprise a CT conductive region 130 and a CT heterogeneous dielectric region 132, where CT conductive region 130 and/or CT heterogeneous dielectric region 132 may store charge carriers (e.g., electrons) during programming of CT-FETs 112.1-112.3. CT conductive region 130 may be disposed on and in substantial contact with bottom dielectric region 124. The material used to form conductive region 130 may be, for example, polysilicon, metal, or any suitable conductive material. Also, CT conductive region 130 may have a vertical dimension 130a between top and bottom surfaces of CT conductive region 130 and a lateral dimension 130b. In an example, vertical dimension 130a may range from about 10 nm to about 20 nm and lateral dimension 130b may be equal or less than a width 115 of doped region 114 or 116. Width 115 may also be referred to as width of active region in the art. Active region may be defined as the region where transistor action occurs of CT-FETs 112.1-112.3.

In an example embodiment, CT heterogeneous dielectric region 132 may be disposed on and in substantial contact with CT conductive region 130. CT heterogeneous dielectric region 132 may have a vertical dimension 132a between top and bottom surfaces of CT heterogeneous dielectric region 132 and a lateral dimension 132b. In an example, vertical dimension 132a may range from about 10 nm to about 15 nm and lateral dimension 132b may be equal or less than width 115 of doped region 114 or 116. According to various examples, vertical dimensions 130a and 132a may be equal or different with respect to each other. In an example, vertical dimension 130a may be greater than 132a.

CT heterogeneous dielectric region 132 may comprise a silicon-rich nitride (SiRN) material, according to an embodiment. That is, a silicon content value of CT heterogeneous dielectric region 132 may be greater than a silicon content value of a standard silicon nitride (SiN) CT layer. For the purposes of this discussion, a standard SiN CT layer refers to a stoichiometric SiN CT layer (e.g., stoichiometric SiN materials). For example, CT heterogeneous dielectric region 132 having SiRN material may have a coefficient of extinction (k) value of, for example, about 1.19, while a standard SiN CT layer may have a coefficient of extinction (k) value of zero, where the coefficient of extinction (k) values are measured at a wavelength of 248 nm. However, the coefficient of extinction (k) is not limited to such values. Instead, the coefficient of extinction (k) may have other values as will be apparent to those skilled in the relevant art(s). Increasing the coefficient of extinction (k) value (i.e., increasing the silicon content) results in CT heterogeneous dielectric region 132 having increased conductive properties. In contrast, a standard SiN CT layer with a low coefficient of extinction (k) exhibits insulating properties.

Figure 1B:
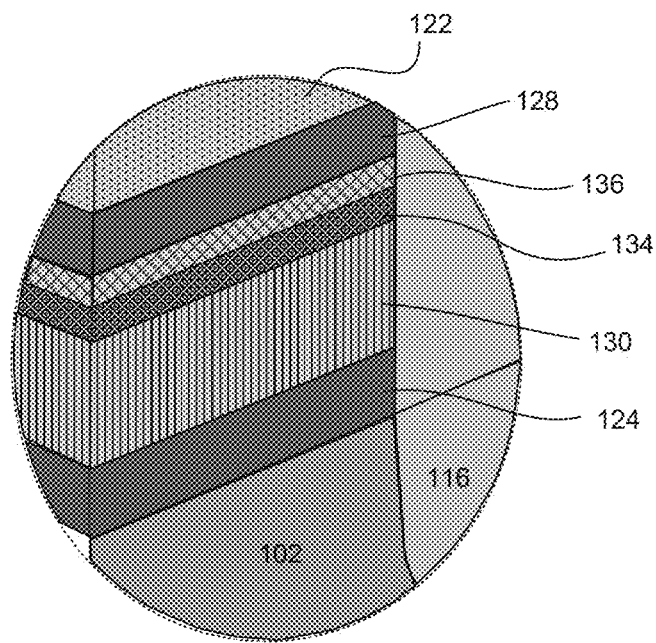
FIGS. 1B-1C illustrate first and second enlarged views of a section of FIG. 1A, according to first and second example embodiments, respectively.
Figure 1C:
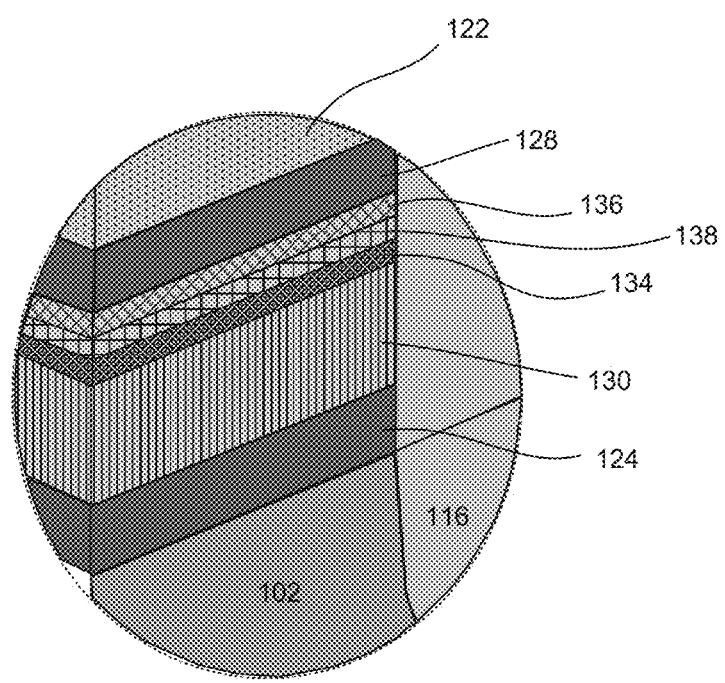

According to various example embodiments, CT heterogeneous dielectric region 132 may comprise two or more SiRN layers each having different silicon content values (e.g., different coefficient of extinction (k) values). According to an embodiment, CT heterogeneous dielectric region 132 may include a bottom SiRN layer 134 (e.g., a layer closest to bottom dielectric region 124) and a top SiRN layer 136 (e.g., a layer closest to top dielectric region 128), as illustrated in FIG. 1B, which is a first enlarged view of the circled area 101 in FIG. 1A. Top SiRN layer 136 may have a higher or lower silicon content value (e.g., a higher or lower coefficient of extinction (k) value) than bottom SiRN layer 134. According to another embodiment, CT heterogeneous dielectric region 132 may include an intermediate layer 138 interposed between bottom SiRN layer 134 and top SiRN layer 136, as illustrated in FIG. 1C, which is a second enlarged view of the circled area 101 in FIG. 1A. Intermediate SiRN layer 138 may have a silicon content value that is between the silicon content values of bottom and top SiRN layers 134 and 136. That is, the silicon content values may be increasing or decreasing as distance from bottom SiRN layer 134 increases. In another example, intermediate SiRN layer 138 may have a silicon content value greater than both bottom and top SiRN layers 134 and 136.

According to various examples, bottom SiRN layer 134 or top SiRN layer 136 may have a coefficient of extinction (k) value of about 1.19, while top SiRN layer 136 or bottom SiRN layer 134 may have a coefficient of extinction (k) value of about zero (i.e., the k value associated with standard SiN materials), respectively. However, the coefficient of extinction (k) values are not limited to such values. Instead, the coefficient of extinction (k) can have other values as will be apparent to those skilled in the relevant art(s). Further, the number of layers in CT heterogeneous dielectric region 132 should not be limited to the examples discussed herein. Instead, CT heterogeneous dielectric region 132 may comprise any suitable number of SiRN layers, without departing from the spirit and scope of the present disclosure.

Top dielectric region 128 may be disposed on and in substantial contact with CT heterogeneous dielectric region 132. The material used to form top dielectric region 128 may be, for example, thermal oxide, silicon dioxide, oxynitride, silicon oxynitride, or any combination thereof. Further, top dielectric region 128 may have a vertical dimension 128a between top and bottom surfaces of top dielectric region 128. In an example, vertical dimension 128a may range from about 5 nm to about 7 nm. In other examples, vertical dimension 128a may be equal or different from vertical dimension 124a of bottom dielectric region 124.

Gate region 122 may be disposed on and in substantial contact with top dielectric region 128 and may have a vertical dimension 122a of about 100 nm. The material used to form gate region 120 may be, for example, doped polysilicon, metal, or any combination thereof.

In an example operation of memory device 100, CT-FETs 112.1-112.3 may be configured to store charge carriers (e.g., electrons) in CT heterogeneous dielectric region 132 and CT conductive region 130 by using channel hot electron (CHE) injection techniques and erased to remove the stored charge carriers using electron Fowler-Nordheim (FN) tunneling erasure techniques or hot hole injection techniques, as known in the art.

It is to be appreciated that embodiments of the present invention may help to prevent program saturation as observed in current CT memory devices due to leakage of charge carriers from storage regions such as CT heterogeneous dielectric region 132 to gate regions such as gate region 122 during programming. The leakage of stored charge carriers in current memory devices may be due to having storage regions extended over the width of doped regions and closer to gate regions. Stored charge carriers are attracted toward gate regions from these extended storage regions due to high voltage at gate regions during programming. Such leakage may be prevented by having lateral dimension 132b of CT heterogeneous dielectric region 132 equal or less than width 115 of doped regions 114 and 116, as discussed above. Preventing leakage of stored charge carriers and as a result, preventing program saturation may help to provide more reliable and improved memory cell performance compared to current CT memory devices.

Also, it is to be appreciated that embodiments of the present invention may further help to provide improved memory cell performance compared to current CT memory devices by preventing or reducing unwanted trapping of charge carriers in spacers or insulating regions (not shown) that may be present adjacent to gate structures 118. Such unwanted trapping of charge carriers during erase operation may be prevented or reduced by CT conductive region 130 of gate structures 118, as discussed above. The presence of CT conductive region 130 in gate structure 118 may help to reduce fringe electric field at edges of gate structure 118. High fringe electric fields at edges of gate structures during erase operation in current CT memory devices may cause charge carriers to be trapped in areas adjacent to gate structures instead of moving from stored regions to substrate, and as a result, may negatively affect performance of memory device.

An Example Method for Fabricating a Memory Device According to a First Embodiment FIGS. 2A-8A and 2B-8B illustrate schematic cross-sectional views along lines A-A and B-B, respectively, of memory device 100 (as illustrated in FIG. 1A) at various stages of its fabrication process according to an embodiment.

Figure 2A:
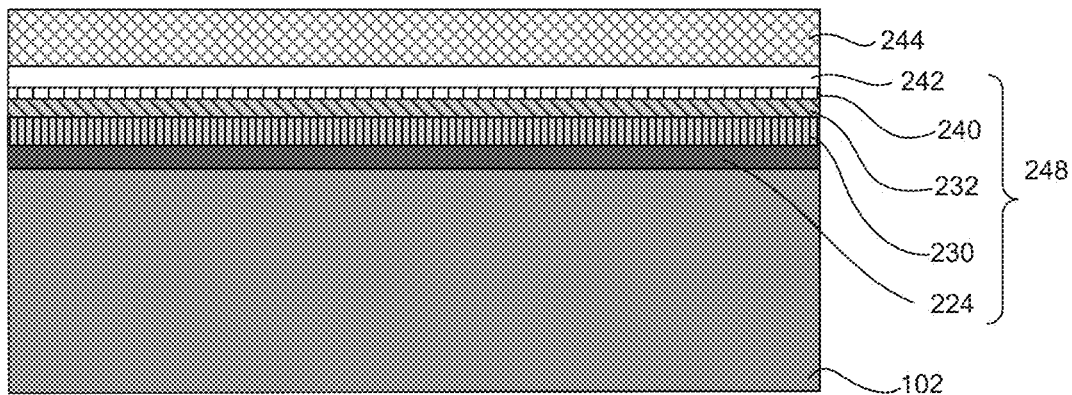
Figure 2B:
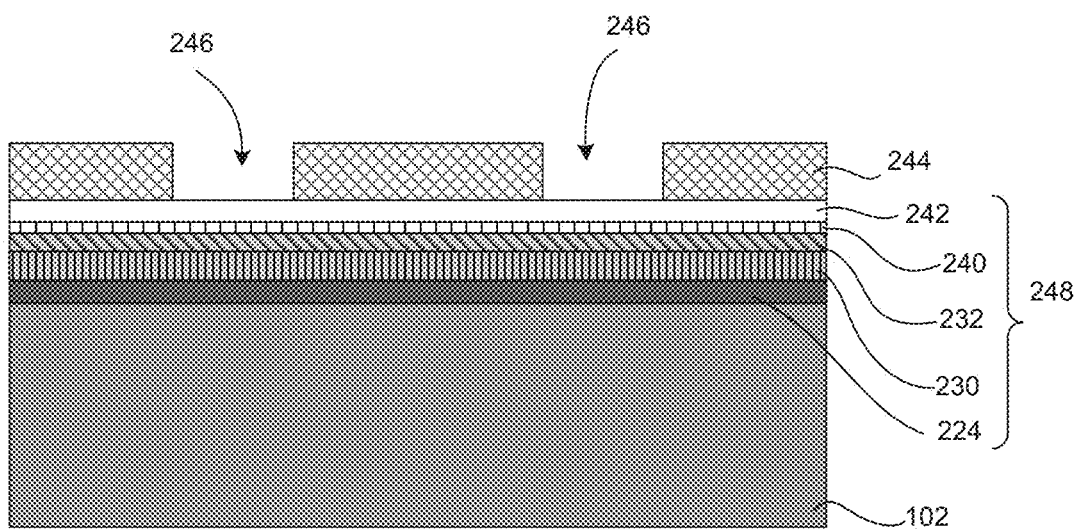

FIGS. 2A-2B illustrate cross-sectional views of a partially fabricated memory device 100 after formation of trench etch areas 246 on a stack of layers 248 disposed on substrate 102, according to an example embodiment. Trench etch areas 246 may be formed by patterning a photoresist layer 244 disposed on stack of layers 248, as shown in FIG. 2B. Patterning of photoresist layer 244 may be performed by standard photolithography and etching processes.

As shown in FIGS. 2A-2B, stack of layers 248 may comprise a first dielectric layer 224, a CT conductive layer 230, a CT dielectric layer 232, an oxide layer 240, and a hard mask layer 242, according to an example embodiment. First dielectric layer 224 may be formed by depositing on substrate 102 a material similar to the material of bottom dielectric region 124 (described above with reference to FIG. 1A). The deposition of first dielectric layer 224 may be performed using any existing deposition methods suitable for dielectric materials. For example, dielectric materials such as, but not limited to, silicon oxide may be deposited for first dielectric layer 224 using an oxidation process in an oxidation furnace, a chemical vapor deposition (CVD), or an in-situ steam generation (ISSG) process. Following the deposition of first dielectric layer 224, CT conductive layer 230 may be formed by depositing on first dielectric layer 224 a material similar to the material of CT conductive region 130 (described above with reference to FIG. 1A). Deposition method used for formation of CT conductive layer 230 may be, for example, a low pressure CVD process. Subsequently, CT dielectric layer 232 comprising a material similar to the material of CT heterogeneous dielectric region 132 (described above with reference to FIG. 1A) may be deposited on CT conductive layer 230, for example, by a CVD process. The relative thickness of first dielectric layer 224, CT conductive layer 230, and CT dielectric layer 232 with respect to each other may be equal or different, according to various embodiments. Thickness of first dielectric layer 224 may range from about 3 nm to about 7 nm, thickness of CT conductive layer 230 may range from about 10 nm to about 20 nm, and thickness of CT dielectric layer 232 may range from about 10 nm to about 15 nm, according to different examples of this embodiment.

Further, oxide layer 240 may be deposited on CT dielectric layer 232 using any current deposition methods suitable for oxide materials. For example, oxide material such as, but not limited to, silicon oxide may be deposited for oxide layer 240 using an oxidation process in an oxidation furnace, a high temperature oxide (HTO) deposition process. The oxide layer 240 deposition may be followed by deposition of hard mask layer 242 on oxide layer 240, for example, by depositing a layer of nitride such as silicon nitride using current deposition methods such as, but not limited to, a CVD or an atomic layer deposition (ALD) process. The thickness of hard mask layer 242 may be greater than oxide layer 240, according to an example embodiment. Thickness of hard mask layer 242 may range from about 60 nm to about 100 nm and thickness of oxide layer 240 may be about 5 nm, according to different examples of this embodiment.

Figure 3A:
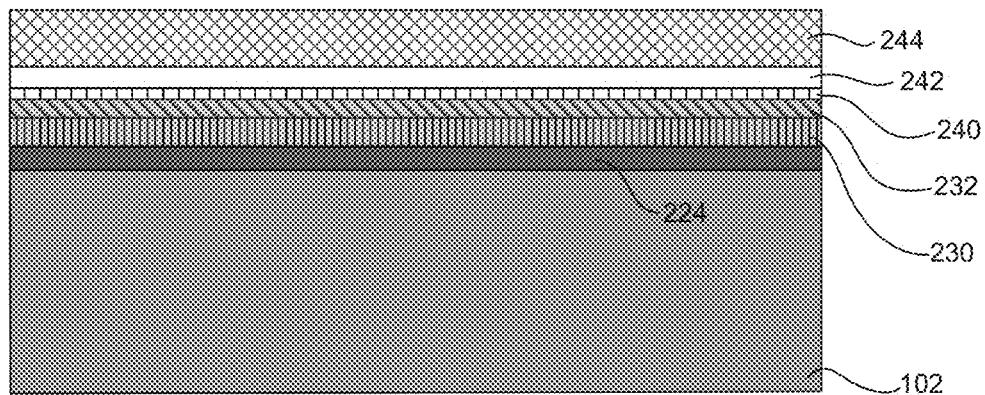
Figure 3B:
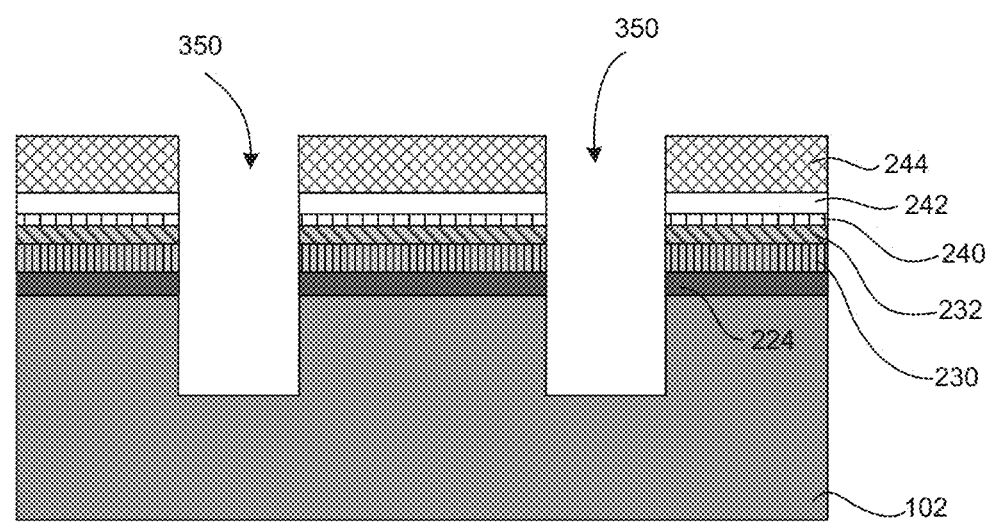

FIGS. 3A-3B illustrate cross-sectional views of a partially fabricated memory device 100 after formation of trenches 350 in trench areas 246 (described above with reference to FIG. 2B), according to an embodiment. The patterned photoresist layer 244 may assist in guiding the formation of trenches 350 in trench etch areas 246, as shown in FIG. 3B. Trenches 350 may be formed by any current etching methods suitable for etching the materials of stack of layers 248 and substrate 102. For example, a wet etch process or a dry etch process such as, but not limited to, reactive ion etching (RIE) may be performed to remove the materials of stack of layers 248 and substrate 102 for the formation of trenches 350, according to an embodiment. The etching process may be performed to selectively etch the materials of stack of layers 248 and substrate 102 in trench etch areas 246 without significant etching or removal of patterned photoresist layer 244 and/or hard mask layer 242. This selective etching may be done by employing an etchant that has higher selectivity to the materials of stack of layers 248 and substrate 102 than to the material of photoresist layer 244. The formation of trenches 350 may be followed by removal of photoresist layer 244 by using any current photoresist removal method. During the removal of photoresist layer 244, hard mask layer 242 may act as an etch-stop layer and prevent removal of oxide layer 240.

Figure 4A:
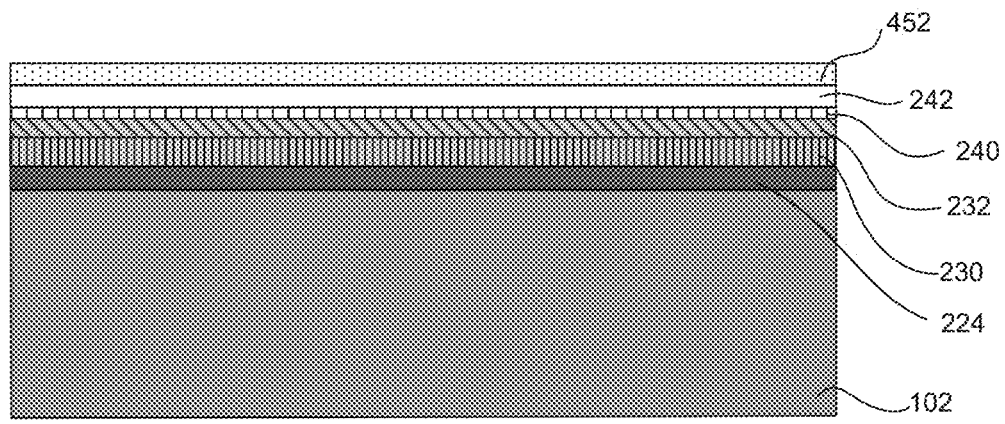
Figure 4B:
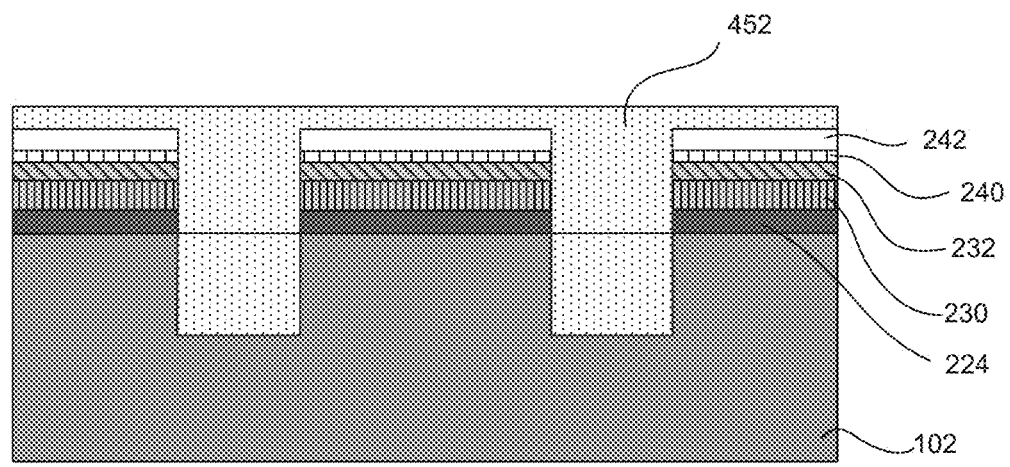
Figure 5A:
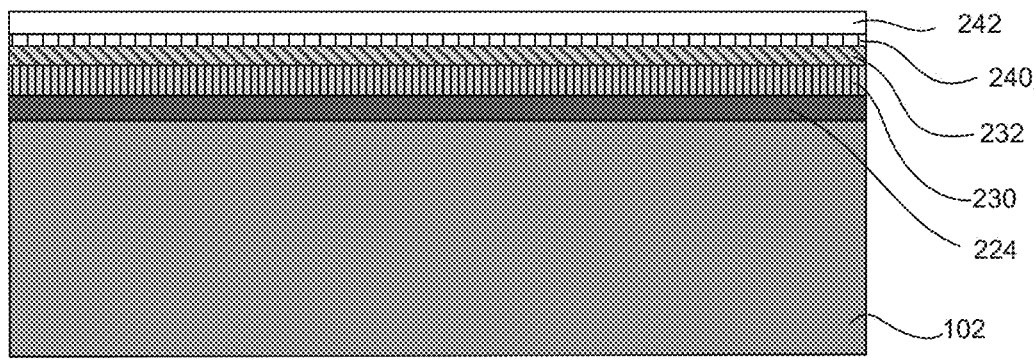
Figure 5B:
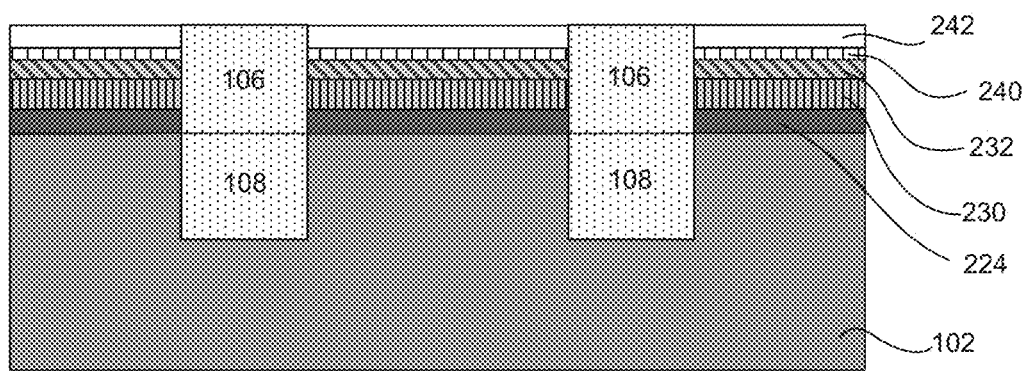

FIGS. 4A-4B and 5A-5B illustrate cross-sectional views of a partially fabricated memory device 100 during filling of trenches 350, according to an example embodiment. The filling of trenches 350 may comprise a deposition process followed by a polishing process. The deposition process may be performed by depositing a layer 452 of dielectric material similar to the material of isolation region 106 and STI region 108 (described with reference to FIG. 1A) over the partially fabricated memory device 100 of FIG. 3A-3B. Layer 452 may be deposited such that at least trenches 350 may be filled, as shown in FIG. 4B. The deposition of layer 452 may be performed using any current deposition methods suitable for dielectric materials. For example, dielectric materials such as, but not limited to, silicon oxide or silicon nitride may be deposited for layer 452 using a CVD process, an ALD process, a high density plasma (HDP) process, or a high aspect ratio process (HARP). Following the deposition of layer 452, a chemical mechanical polishing (CMP) process may be performed to remove layer 452 from any areas except for trenches 350 to yield raised isolation region 106 and STI region 108 as shown in FIG. 5B.

Figure 6A:
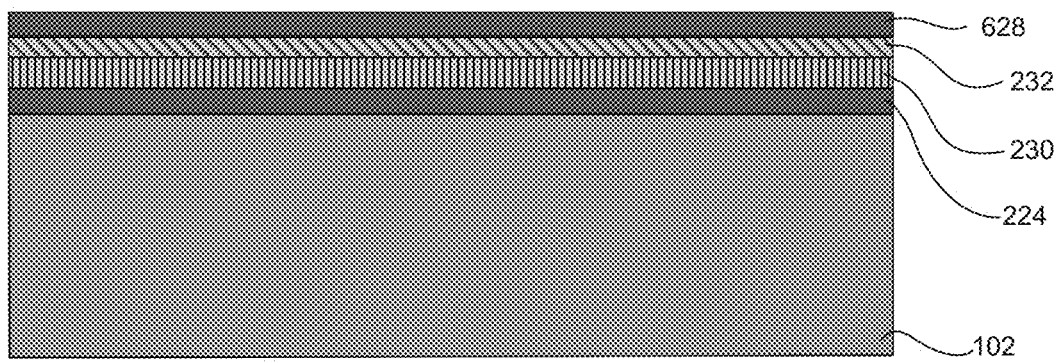
Figure 6B:
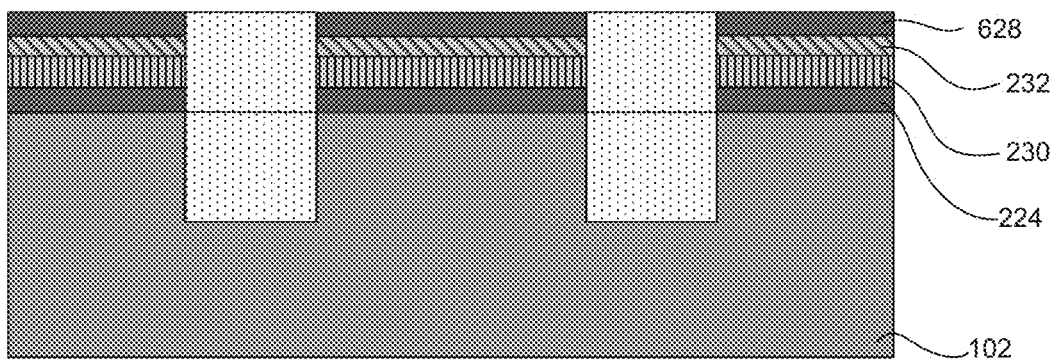

During the CMP process, hard mask layer 242 may act as a polishing stop layer to prevent CT dielectric layer 232 from being removed and layer 452 may be polished down to hard mask layer 242. All or portions of hard mask layer 242 may be removed during the CMP process. Following the formation of layer 452 in trenches 350, oxide layer 240 and remaining hard mask layer 242 may be selectively etched using, for example, a wet etch method without significant etching or removal of underlying CT dielectric layer 232. The removal of hard mask layer 242 and oxide layer 240 may be followed by formation of a second dielectric layer 628, as shown in FIGS. 6A-6B.

Second dielectric layer 628 comprising a material similar to the material of top dielectric region 128 (described above with reference to FIG. 1A) may be formed on CT dielectric layer 232. The formation of second dielectric layer 628 may be performed by plasma oxidation of top surface of CT dielectric layer 232, according to an embodiment. In another embodiment, second dielectric layer 628 may be formed by using any current deposition methods suitable for dielectric materials. For example, dielectric materials such as, but not limited to, silicon oxide may be deposited for first dielectric layer 628 using a CVD, HTO, or an in-situ steam generation (ISSG) process. In a further embodiment, formation of second dielectric layer 628 may comprise depositing a nitride layer (e.g., SiN) on CT dielectric layer 232 using any suitable deposition method of depositing nitride material followed by oxidation of the deposited nitride layer using, for example, an ISSG process. Thickness of deposited second dielectric layer 628 may range from about 5 nm to about 7 nm, according to various examples.

Figure 7A:
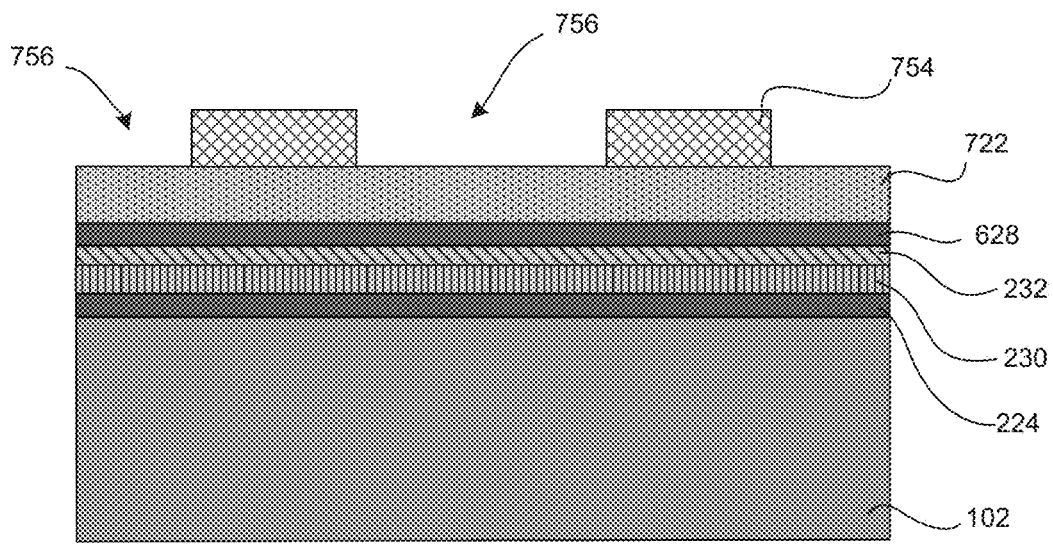
Figure 7B:
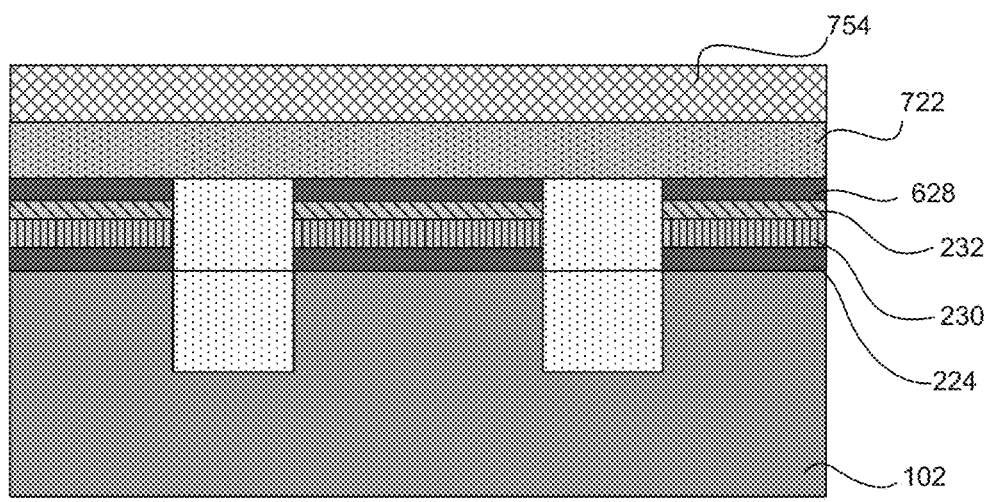

FIGS. 7A-7B illustrate cross-sectional views of a partially fabricated memory device 100 after formation of a second conductive layer 722 and patterning of a photoresist layer 754, according to an example embodiment. Second conductive layer 722 may be formed by depositing on second dielectric layer 628 and raised isolation region 106 a material similar to the material of gate region 122 (described above with reference to FIG. 1A). Second conductive layer 722 may be deposited using, for example, any suitable deposition methods of depositing polysilicon or metals such as, but not limited to, a low pressure CVD process. Deposition of second conductive layer 722 may be followed by deposition and patterning of a photoresist layer 754 to form etch areas 756, as shown in FIGS. 7A-7B. Patterning of photoresist layer 754 may be performed by standard photolithography and etching processes.

Figure 8A:
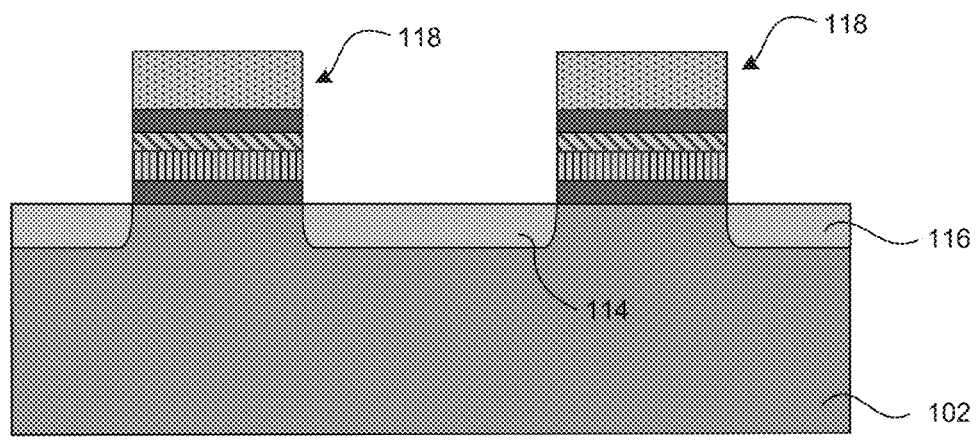
Figure 8B:
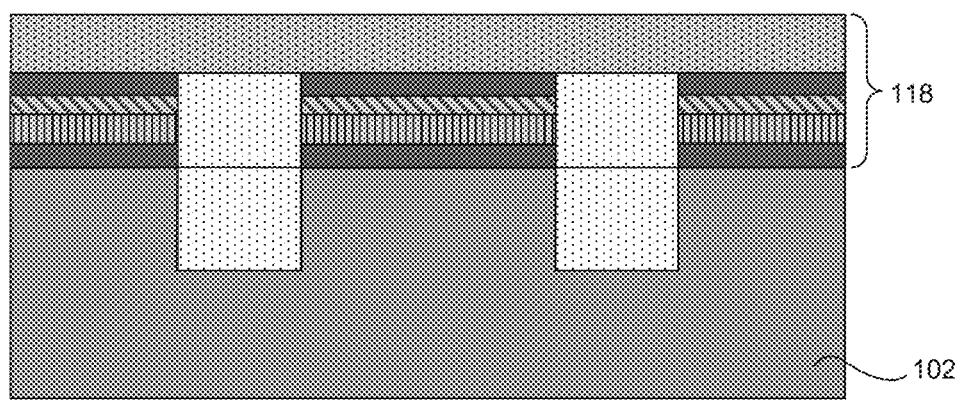

FIGS. 8A-8B illustrate cross-sectional views of a partially fabricated memory device 100 after formation of gate structures 118 and doped regions 114 and 116 (described above with reference to FIG. 1A), according to an example embodiment. The formation of gate structures 118 may comprise an etch process. The etch process may be performed in etch areas 756 to remove portions of first dielectric layer 224, CT conductive layer 230, CT dielectric layer 232, second dielectric layer 628, and second conductive layer 722 that are in etch areas 756, as shown in FIG. 8A. The etch process may be followed by removal of photoresist layer 754 by using any current photoresist removal method to yield gate structures 118 as shown in FIG. 8A. Formation of gate structures 118 may be followed by formation of doped regions 114 and 116, according to an embodiment. Doped regions 114 and 116 may be formed by an ion implantation method.

It should be understood that the various layers illustrated during the example fabrication process of IC 100 are not necessarily drawn to scale. In addition, the above description is meant to provide a general overview of select steps involved in forming IC 100 shown in FIG. 1A and that, in actual practice, more features and/or fabrication steps may be performed additionally or alternatively to that described herein to form IC 100, as would be understood by one skilled in the art given the description herein.

Example Steps for Fabricating a Memory Device According to an Embodiment

Figure 9:
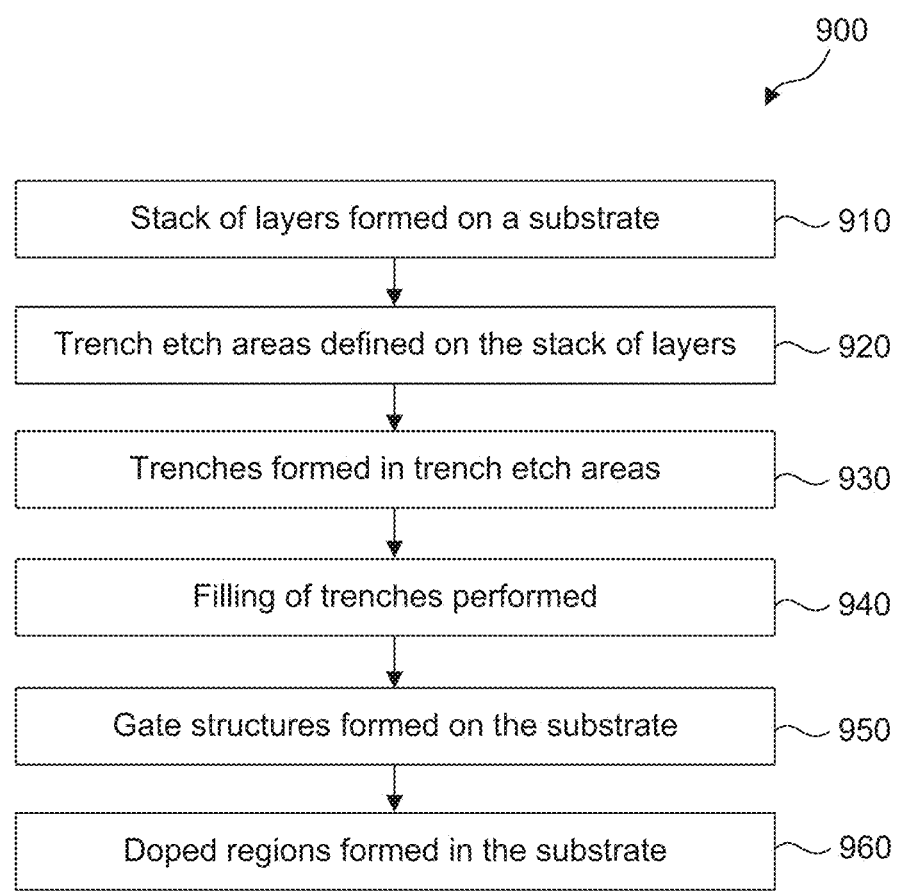
FIG. 9 illustrates a flowchart for a method of fabricating a memory device, according to an example embodiment.

FIG. 9 illustrates a flowchart 900 for a method of fabricating memory device 100 as illustrated in FIGS. 1A-1C. Solely for illustrative purposes, the steps illustrated in FIG. 9 will be described with reference to example fabrication process illustrated in FIGS. 2A-8A and 2B-8B. Steps can be performed in a different order or not performed depending on specific applications.

In step 910, a stack of layers is formed on a substrate, according to an example of this embodiment. For example, a stack of layers such as stack of layers 248 comprising first dielectric layer 224, CT conductive layer 230, CT dielectric layer 232, oxide layer 240, and hard mask layer 242 may be formed on substrate 102, as illustrated in FIGS. 2A-2B. First dielectric layer 224 may be formed by depositing dielectric materials such as, but not limited to, silicon oxide on substrate 102 using an oxidation process in oxidation furnace, a CVD or an ISSG process. Subsequently, CT conductive layer 230 may be formed by depositing conductive materials such as, but not limited to, polysilicon on first dielectric layer 224 using a low pressure CVD process. CT dielectric layer 232 may be formed by depositing nitride materials such as, but not limited to, SiRN on CT conductive layer 230 using a CVD, ALD, or HTO process. Further, oxide layer 240 may be deposited on CT dielectric layer 232 using an HTO deposition process. The oxide layer 240 deposition may be followed by deposition of hard mask layer 242 on oxide layer 240 by depositing a layer of nitride such as silicon nitride using a CVD or an ALD process.

In step 920, trench etch areas are formed on the stack of layer of step 910, according to an example of this embodiment. For example, trench etch areas such as trench etch area 246 may be defined by patterning of stack of layers 248, as shown in FIG. 2B. Patterning may be performed by standard photolithography and etching processes.

In step 930, trenches are formed in the trench etch areas of step 920, according to an example of this embodiment. For example, trenches such as trenches 350 may be formed in trench etch areas 246, as shown in FIG. 3B, by a wet etch process and/or a dry etch process such as, but not limited to, RIE to remove the materials of stack of layers 248 and substrate 102 in trench etch areas 246. The etching process may be performed to selectively etch the materials in trench etch areas 246 without significant etching or removal of photoresist layer 244 and/or hard mask layer 242.

In step 940, the trenches of step 930 are filled, according to an example of this embodiment. For example, the trenches may be filled as described above with reference to FIGS. 4A-4B and 5A-5B for trenches 350. The filling of trenches 350 may be performed by depositing layer 452 of dielectric materials such as, but not limited to, silicon oxide or silicon nitride within trenches 350 using a CVD process, an ALD process, a high density plasma (HDP) process, or a high aspect ratio process (HARP). The deposition of layer 452 may be followed by a CMP process to remove layer 452 from any areas except for trenches 350 to yield raised isolation region 106 and STI region 108 as shown in FIG. 5B.

In step 950, gate structures are formed on substrate 102, according to an example of this embodiment. For example, gate structures such as gate structures 118 may be formed on substrate 102, as described above with reference to FIGS. 7A-7B and 8A-8B.

In step 960, doped regions are formed in the substrate, according to an example of this embodiment. For example, doped regions such as doped regions 114 and 116 may be formed, as shown in FIG. 8A. Doped regions 114 and 116 may be formed by an ion implantation method.

It should be noted that, although the above method description and related figures describe fabricating only one arrangement of trench 130 interposed between adjacent devices 108a and 108b for the sake of simplicity. However, as would be understood by a person of skilled in the art based on the description herein, the above steps may be applied to fabricate any number of such arrangements with devices and trenches similar to devices 108 and trench 130, respectively.

Those skilled in the relevant art(s) will recognize that the above method 500 may additionally or alternatively include any of the steps or sub-steps described above with respect to FIGS. 2A-2G and 3A-3G, as well as any of their modifications. Further, the above description of the example method 500 should not be construed to limit the description of memory cell array structure 100 described above.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not be limited to any particular type of semiconductor devices.

In embodiments, the term "etch" or "etching" or "etchback" generally describes a fabrication process of patterning a material, such that at least a portion of the material remains after the etch is completed. For example, generally the process of etching a semiconductor material involves the steps of patterning a masking layer (e.g., photoresist or a hard mask) over the semiconductor material, subsequently removing areas of the semiconductor material that are no longer protected by the mask layer, and optionally removing remaining portions of the mask layer. Generally, the removing step is conducted using an "etchant" that has a "selectivity" that is higher to the semiconductor material than to the mask layer. As such, the areas of semiconductor material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

In an embodiment, the term "selectivity" between two materials is described as the ratio between the etch rates of the two materials under the same etching conditions. For example, an etchant with a selectivity of 3:1 to the semiconductor material over the mask layer means that the etchant removes the semiconductor material at a rate three times faster than that at which it removes the mask layer.

In an embodiment, the terms "deposit" or "dispose" describe the act of applying a layer of material to the substrate. Such terms are meant to describe any possible layer-forming technique including, but not limited to, thermal growth, sputtering, evaporation, chemical vapor deposition, epitaxial growth, atomic layer deposition, electroplating, etc.

In an embodiment, the term "substrate" describes a material onto which subsequent material layers are added. In embodiments, the substrate itself may be patterned and materials added on top of it may also be patterned, or may remain without patterning. Furthermore, "substrate" may be any of a wide array of semiconductor materials such as silicon, germanium, gallium arsenide, indium phosphide, etc. In other embodiments, the substrate may be electrically non-conductive such as a glass or sapphire wafer.

In an embodiment, the term "substantially perpendicular," in reference to a topographical feature's sidewall, generally describes a sidewall disposed at an angle ranging between about 85 degrees and 90 degrees with respect to the substrate.

In an embodiment, the term "substantially in contact" means the elements or structures in substantial contact can be in physical contact with each other with only a slight separation from each other.

In an embodiment, devices fabricated in and/or on the substrate may be in several regions of the substrate, and these regions may not be mutually exclusive. That is, in some embodiments, portions of one or more regions may overlap.

What is claimed is:

1. A charge trapping field effect transistor (FET), comprising:
   a semiconductor substrate;
   a doped region in the semiconductor substrate, wherein the doped region comprises a first lateral dimension along a first direction between a first isolation region and a second isolation region; and
   a gate structure over the semiconductor substrate adjacent to the first isolation region and the second isolation region, comprising:
     a hybrid charge trapping conductive region comprising:
       a charge trapping dielectric region comprising at least top and bottom silicon rich nitride (SiRN) layers separated by an intermediate SiRN layer, wherein the intermediate SiRN layer has a greater silicon content value than the top and bottom SiRN layers respectively; and
       a charge trapping conductive region in contact with the charge trapping dielectric region;
     wherein the charge trapping dielectric region comprises a second lateral dimension along the first direction, the second lateral dimension being equal to or smaller than the first lateral dimension, wherein the first isolation region has a first vertical dimension, wherein the hybrid charge trapping conductive region has a second vertical dimension, and wherein the first vertical dimension is larger than the second vertical dimension.

2. The charge trapping FET of claim 1, wherein the charge trapping conductive region comprises a third lateral dimension along the first direction, the third lateral dimension being equal or smaller than the first lateral dimension.

3. The charge trapping FET of claim 1, wherein the charge trapping dielectric region comprises silicon rich nitride (SiRN).

4. The charge trapping FET of claim 3, wherein the silicon rich nitride (SiRN) has a coefficient of extinction (k) value greater than zero.

5. The charge trapping FET of claim 1, wherein the charge trapping dielectric region comprises a plurality of silicon rich nitride (SiRN) layers, each SiRN layer of the plurality of SiRN layers comprising a silicon content value different from each other SiRN layer in the plurality of SiRN layers.

6. The charge trapping FET of claim 1, wherein the charge trapping dielectric region comprises a plurality of silicon rich nitride (SiRN) layers, each SiRN layer of the plurality of SiRN layers comprising a coefficient of extinction (k) value different from each other SiRN layer in the plurality of SiRN layers.

7. The charge trapping FET of claim 1, wherein the charge trapping dielectric region comprises a silicon nitride (SiN) layer and a plurality of silicon rich nitride (SiRN) layers, wherein:
   the SiN layer is disposed over the plurality of SiRN layers;
   the SiN comprises a coefficient of extinction (k) value equal to zero; and
   each SiRN layer of the plurality of SiRN layers comprising a coefficient of extinction (k) value different from each other SiRN layer in the plurality of SiRN layers.

8. The charge trapping FET of claim 1, wherein the charge trapping dielectric region comprises a vertical dimension ranging from about 10 nm to about 15 nm.

9. The charge trapping FET of claim 1, wherein the charge trapping conductive region comprises a vertical dimension ranging from about 10 nm to about 20 nm.

10. The charge trapping FET of claim 1, wherein the charge trapping conductive region comprises polysilicon or metal.

11. The charge trapping FET of claim 1, wherein the gate structure further comprises:

first and second dielectric regions, the first dielectric region being in contact with the charge trapping dielectric region and the second dielectric region being in contact with the charge conductive region.

12. The charge trapping FET of claim 11, wherein the first and second dielectric regions comprise an oxide material.

13. The charge trapping FET of claim 11, wherein the gate structure further comprises a gate region in contact with the first dielectric region.

14. A method of fabricating a charge trapping memory device, comprising:
 forming isolation regions in a substrate;
 forming a hybrid charge trapping conductive region, wherein forming the hybrid charge trapping conductive region comprises:
  forming a charge trapping conductive region adjacent to a first isolation region and a second isolation region;
  forming a charge trapping dielectric region comprising at least top and bottom silicon rich nitride (SiRN) layer separated by an intermediate SiRN layer over the charge trapping conductive region, wherein the intermediate SiRN layer has a silicon content value that is greater than the top and bottom SiRN layers respectively; and
 forming a doped region in the substrate, wherein the doped region is formed with a first lateral dimension along a first direction between the first isolation region and the second isolation region; and
 wherein the charge trapping dielectric region is formed with a second lateral dimension along the first direction, the second lateral dimension being equal to or smaller than the first lateral dimension, wherein the first isolation region has a first vertical dimension, wherein the hybrid charge trapping conductive region has a second vertical dimension, and wherein the first vertical dimension is larger than the second vertical dimension, and wherein the charge trapping dielectric region is lower than a top of the first isolation region.

15. The method of claim 14, further comprising:
 forming a first dielectric region over the substrate;
 forming a second dielectric region over the charge trapping dielectric region; and
 forming a gate region over the second dielectric region.

16. The method of claim 15, wherein forming the second dielectric region comprises oxidation of a top surface of the charge trapping dielectric region.

17. The method of claim 14, wherein forming the isolation region comprises:
 forming a trench in the substrate; and
 filling the trench with a dielectric material.

18. The method of claim 14, wherein:
 the charge trapping conductive region is formed with a third lateral dimension along the first direction, the third lateral dimension being equal or smaller than the first lateral dimension.

19. The method of claim 14, wherein the top, intermediate, and bottom SiRN layers each includes a coefficient of extinction (K) value greater than zero.

20. The method of claim 14, wherein the charge trapping dielectric region comprises a plurality of silicon rich nitride (SiRN) layers including the top, intermediate, and bottom SiRN layers, each SiRN layer of the plurality of SiRN layers comprising a silicon content value different from each other SiRN layer in the plurality of SiRN layers.

21. The method of claim 14, wherein the charge trapping conductive region comprises polysilicon.

22. A method to fabricate a semiconductor device, comprising:
 forming sequentially a first dielectric layer, a charge trapping (CT) conductive layer, and a CT dielectric structure including at least one silicon rich nitride (SiRN) layer over a substrate, wherein the CT dielectric structure includes a bottom SiRN layer over the CT conductive layer, an intermediate SiRN layer over the bottom SiRN layer, and a top SiRN layer over the intermediate SiRN layer, and wherein the top, intermediate, and bottom SiRN layers each has a different silicon content value from one another;
 forming a hard mask layer over the CT dielectric structure;
 forming a trench by removing a portion of the substrate, the first dielectric layer, the CT conductive layer, the CT dielectric structure, and the hard mask layer, wherein the trench separating gate structures of two transistors, each on one side of the trench;
 filling the trench with a dielectric material to form an isolation structure;
 performing a planarization process on the dielectric material outside of the trench, the planarization process stopped at the hard mask layer;
 removing the hard mask layer entirely and form a second dielectric layer over the CT dielectric structure; and
 forming a gate line layer over and in direct contact with both the isolation structure and the second dielectric layer.

23. The method of claim 22, wherein the intermediate SiRN layer has a silicon content value that is between the top and bottom SiRN layers.

24. The method of claim 22, wherein the intermediate SiRN layer has a silicon content value that is greater than the top and bottom SiRN layers, respectively.

* * * * *